US009008251B2

United States Patent
Chen et al.

(10) Patent No.: US 9,008,251 B2
(45) Date of Patent: Apr. 14, 2015

(54) ADAPTIVE PHASE-SHIFTED SYNCHRONIZATION CLOCK GENERATION CIRCUIT AND METHOD FOR GENERATING PHASE-SHIFTED SYNCHRONIZATION CLOCK

(71) Applicants: Isaac Chen, Zhubei (TW); An-Tung Chen, Pingzhen (TW)

(72) Inventors: Isaac Chen, Zhubei (TW); An-Tung Chen, Pingzhen (TW)

(73) Assignee: Richtek Technology Corporation, Chupei, Hsin-Chu (TW)

( * ) Notice: Subject to any disclaimer, the term of this patent is extended or adjusted under 35 U.S.C. 154(b) by 0 days.

(21) Appl. No.: 14/070,518

(22) Filed: Nov. 2, 2013

(65) Prior Publication Data

US 2014/0055178 A1  Feb. 27, 2014

Related U.S. Application Data

(63) Continuation of application No. 12/930,941, filed on Jan. 20, 2011, now Pat. No. 8,605,845.

(30) Foreign Application Priority Data

May 17, 2010 (TW) .................................. 099115705

(51) Int. Cl.
| | | |
|---|---|---|
| G06F 1/04 | (2006.01) |
| H02M 3/156 | (2006.01) |
| H03K 5/15 | (2006.01) |
| H02J 3/01 | (2006.01) |
| H02M 3/158 | (2006.01) |

(52) U.S. Cl.
CPC ... *H03K 5/15073* (2013.01); *H02M 2003/1586* (2013.01); *H02J 3/01* (2013.01); *G06F 1/04* (2013.01)

(58) Field of Classification Search
CPC .............. H02M 3/1584; H02M 3/157; H02M 2003/1586; H02M 2001/007; H02J 3/01
USPC .......... 375/354; 323/272, 271, 268, 265, 234, 323/283, 282; 307/82, 43
See application file for complete search history.

(56) References Cited

U.S. PATENT DOCUMENTS

| | | | | |
|---|---|---|---|---|
| 5,777,944 A | * | 7/1998 | Knaack et al. ........... | 365/230.06 |
| 5,929,618 A | * | 7/1999 | Boylan et al. ................. | 323/282 |
| 5,982,209 A | | 11/1999 | Magazzu' et al. | |
| 6,670,794 B1 | | 12/2003 | Wang et al. | |
| 7,259,687 B2 | | 8/2007 | Wiktor et al. | |

(Continued)

OTHER PUBLICATIONS

Graf, Rudolf F., Modern Dictionary of Electronics, 1999, Newnes, 7$^{th}$ Ed., p. 431.*

*Primary Examiner* — Chieh M Fan
*Assistant Examiner* — Michelle M Koeth
(74) *Attorney, Agent, or Firm* — Tung & Associates

(57) ABSTRACT

The present invention discloses an adaptive phase-shifted synchronization clock generation circuit and a method for generating phase-shifted synchronization clock. The adaptive phase-shifted synchronization clock generation circuit includes: a current source generating a current which flows through a node to generate a node voltage on the node; a reverse-proportional voltage generator coupled to the node for generating a voltage which is reverse-proportional to the node voltage; a ramp generator receiving a synchronization input signal and generating a ramp signal; a comparator comparing the reverse-proportional voltage to the ramp signal; and a pulse generator for generating a clock signal according to an output from the comparator.

13 Claims, 5 Drawing Sheets

(56) References Cited

U.S. PATENT DOCUMENTS

| | | | |
|---|---|---|---|
| 7,394,232 B2 * | 7/2008 | Hendrix et al. | 323/272 |
| 8,242,704 B2 * | 8/2012 | Lethellier | 315/276 |
| 2006/0239040 A1 * | 10/2006 | Fukumoto | 363/21.01 |
| 2009/0284233 A1 * | 11/2009 | Murdock et al. | 323/205 |
| 2010/0066257 A1 * | 3/2010 | Lin et al. | 315/161 |

* cited by examiner

ADAPTIVE PHASE-SHIFTED SYNCHRONIZATION CLOCK GENERATION CIRCUIT AND METHOD FOR GENERATING PHASE-SHIFTED SYNCHRONIZATION CLOCK

CROSS REFERENCE

The present application is a continuation application of U.S. Ser. No. 12/930,941, filed on Jan. 20, 2011.

BACKGROUND OF THE INVENTION

1. Field of Invention

The present invention relates to an adaptive phase-shifted synchronization clock generation circuit and a method for generating phase-shifted synchronization clock, in particular to one that automatically detects the number of circuit modules to adaptively determine a phase difference.

2. Description of Related Art

Please refer to FIG. 1, wherein multiple switching circuit modules PWM[1]-PWM[N] receive the same input voltage Vin. If every circuit module has the same clock phase, that is, the power switches in all the circuit modules are conducted at the same time, a large ripple would be generated at the input side, as shown in FIG. 2. And a capacitor Cin with a large capacitance is required to eliminate the coupling effect caused by the large ripple. As shown in FIG. 3, if the clock phases of the switching circuit modules are shifted from one another, the ripple effect at the input side can be alleviated. The switching circuit modules may be, for example, switching power regulators which convert the voltage Vin into respective output voltages (Vo[1]-Vo[N]), or may be other circuits controlled by pulse-width modulation (PWM) signals. A similar problem may also occur when multiple switching power regulators provide power to the same output node.

U.S. Pat. Nos. 7,259,687; 7,493,504; and 7,504,895 propose methods of shifting clock phases, but they cannot automatically determine the phase difference between two circuit modules according to the total number of circuit modules in a circuit. These prior art patents can provide only a fixed phase difference (such as 90° or 180°) between two circuit modules, or they require an external setting to determine the phase difference. For example, U.S. Pat. No. 7,259,687 discloses the structure as shown in FIG. 4, wherein whenever a circuit module is inserted, a resistor R has to be connected correspondingly; in other words, this prior art sets the phase difference between circuit modules according to the number of the connected resistors. However, from the viewpoint of a circuit board manufacturer, because the number of the circuit modules to be actually mounted is unknown, the number of the resistors cannot be determined in advance, and therefore it lacks flexibility in production. Alternatively, if the resistors are not provided in advance on the circuit board, it would be inconvenient for a user because the user has to connect the resistors by himself at the time of actual use.

In view of such drawback, the present invention proposes an adaptive phase-shifted synchronization clock generation circuit and a method for generating phase-shifted synchronization clock, wherein the phase difference can be automatically and adaptively determined without manual setting.

SUMMARY OF THE INVENTION

An objective of the present invention is to provide an adaptive phase-shifted synchronization clock generation circuit.

Another objective of the present invention is to provide a method for generating phase-shifted synchronization clock.

To achieve the foregoing objectives, in one perspective of the present invention, it provides an adaptive phase-shifted synchronization clock generation circuit, comprising: a first current source generating a current which flows through a node to generate a node voltage on the node; an inverse-proportional voltage generator coupled to the node for generating a voltage which is inverse-proportional to the node voltage; a ramp generator receiving a synchronization input signal and generating a ramp signal; a first comparator comparing the inverse-proportional voltage to the ramp signal; and a pulse generator for generating a clock signal according to an output from the first comparator.

In another perspective of the present invention, it provides an adaptive phase-shifted synchronization clock generation circuit, comprising: a current-to-voltage converter circuit coupled to a phase setting node; and a plurality of circuit modules each including: at least one current source generating a current which flows through a node to generate a node voltage on the node; an inverse-proportional voltage generator coupled to the node for generating a voltage which is inverse-proportional to the node voltage; a ramp generator receiving a synchronization input signal from a synchronization signal input pin and generating a ramp signal; a comparator comparing the inverse-proportional voltage to the ramp signal; and a pulse generator for generating a clock signal according to an output from the comparator, the clock signal being provided as an internal clock signal of the corresponding circuit module and outputted from a synchronization signal output pin as a synchronization output signal; wherein the synchronization signal input pin of the first one of the circuit modules receives a system clock and the synchronization signal input pin of each of the other circuit modules receives the synchronization output signal from the previous circuit module as the synchronization input signal of the present circuit module.

The foregoing adaptive phase-shifted synchronization clock generation circuit may further comprise: at least one bypass resistor coupled between the synchronization input signal pin and the synchronization output signal pin of one of the circuit modules.

In a further other perspective of the present invention, it provides a method for generating phase-shifted synchronization clock, comprising: generating a current which flows through a node to generate a node voltage on the node; generating a voltage which is inverse-proportional to the node voltage; comparing the inverse-proportional voltage to a ramp signal whose period is determined by a synchronization input signal; and generating a clock signal according to the comparison result.

In the foregoing phase-shifted synchronization clock generation circuit and method, the inverse-proportional voltage can be generated by various ways, such as: converting the node voltage on the node to a current which flows through a variable resistor, wherein the resistance of the variable resistor is inverse-proportional to the node voltage; and generating a voltage which is direct proportional to the node voltage. Or, the inverse-proportional voltage can be generated by looking up a mapping table which maps a given node voltage to a corresponding inverse-proportional voltage. Or, the node voltage can be converted to a digital signal; an inverse proportion of the digital signal is calculated; and the result is converted to an analog signal.

The objectives, technical details, features, and effects of the present invention will be better understood with regard to the detailed description of the embodiments below, with reference to the drawings.

DESCRIPTION OF THE PREFERRED EMBODIMENTS

Figure 5:
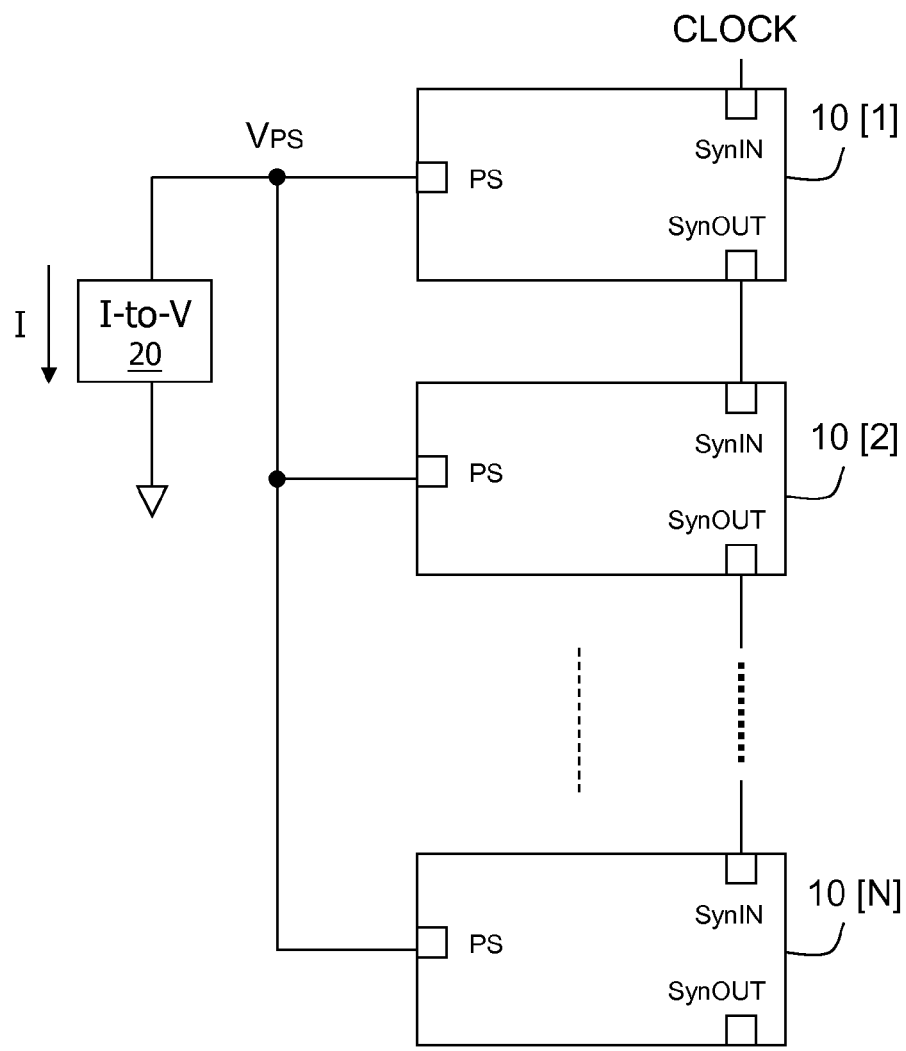
FIG. 5 illustrates a structure of the present invention.

Please refer to FIG. 5. In the present invention, it is not necessary for a circuit board manufacturer to know the exact number of circuit modules. No matter how many circuit modules are mounted, the layout and circuit structure of the circuit board can be the same. And from the user's viewpoint, it is not necessary to adjust the setting according to the number of circuit modules. Hence, the present invention is much more convenient than the prior art. As shown in the figure, a user can connect any number of circuit modules 10[1]-10[N] to the same node VPS as he desires; the node VPS is connected to one end of a current-to-voltage (I-to-V) converter circuit 20, by which a current I flowing therethrough is converted to a voltage on the node VPS. The simplest form of the current-to-voltage converter circuit 20 is a resistor, but it can be of other more complicated forms. Each circuit module of the 10[1]-10[N] has a phase-setting pin PS, a synchronization signal input pin SynIN and a synchronization signal output pin SynOUT, wherein the synchronization output signal pin SynOUT of a previous stage circuit module is connected to the synchronization signal input pin SynIN of the next stage circuit module, and all the phase-setting pins PS are connected to the node VPS. The synchronization signal input pin SynIN of the first stage circuit module 10[1] receives a system clock. The synchronization signal output pin SynOUT of the last stage circuit modules 10[N] is not used, so it is not necessary for the last one of the circuit modules to provide a synchronization signal output pin SynOUT.

Figure 6:
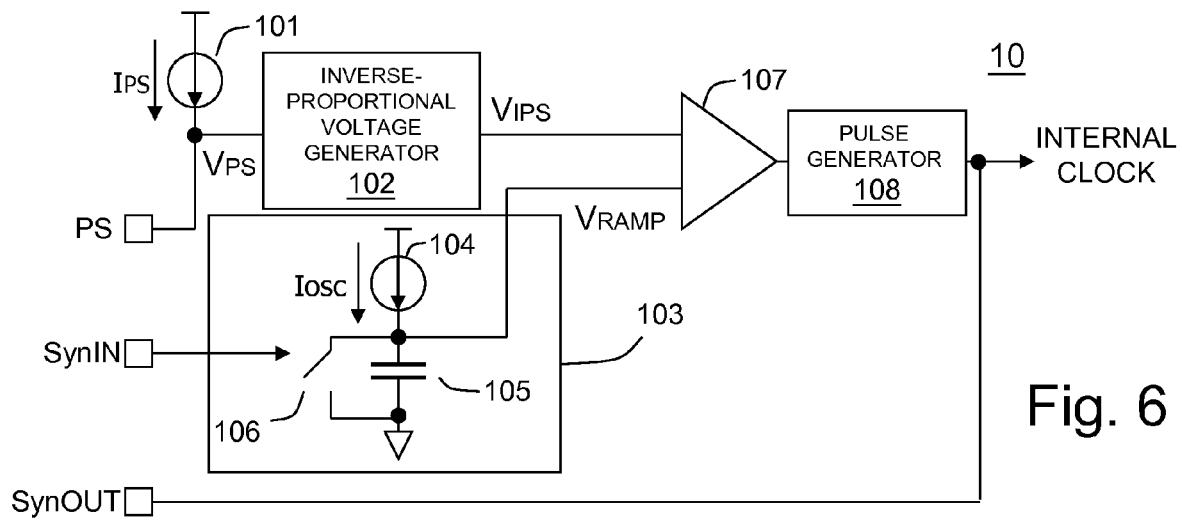
FIG. 6 illustrates an embodiment of the circuit module.

FIG. 6 shows an embodiment of the circuit module 10, which includes a current source 101, an inverse-proportional voltage generator 102, a ramp generator 103, a comparator 107, and a pulse generator 108. A typical structure of the ramp generator 103 includes a current source 104, a capacitance 105, and a switch 106.

Figure 7:
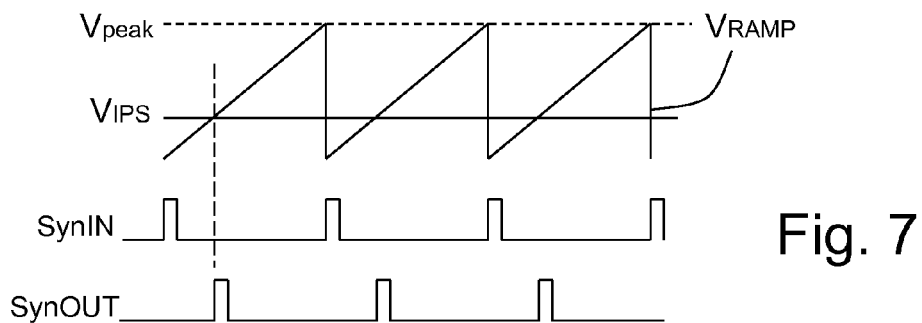
FIG. 7 illustrates the waveforms of the signals VIPS, VRAMP, SynIN and SynOUT.

Please refer to FIGS. 5, 6 and 7 in conjunction. The current source 101 provides a current IPS flowing through the pin PS to the current-to-voltage converter circuit 20 in FIG. 5. Because the pins PS of all the circuit modules are coupled to the same node, $I=N \cdot IPS$, and the voltage VPS is in direct proportion to $N \cdot IPS$. If the current-to-voltage converter circuit 20 is a resistor with a resistance of r, then $VPS=r \cdot N \cdot IPS$. The inverse-proportional voltage generator 102 generates a voltage VIPS which is roughly inverse-proportional to the voltage VPS, that is, VIPS is roughly in direct proportion to 1/VPS, wherein the relationship between the voltages VIPS and VPS does not have to be in absolutely precise inverse-proportion. The details about the inverse-proportional voltage generator 102 will be described later. The ramp generator 103 receives a synchronization input signal SynIN and generates a ramp signal VRAMP. The capacitor 105 in the ramp generator 103 is charged by the current source 104; when the synchronization input signal SynIN turns ON the switch 106, the capacitor 105 discharges, as shown by the relationship between the ramp signal VRAMP and the synchronization input signal SynIN in FIG. 7. The comparator 107 compares the voltage VIPS and the ramp signal VRAMP. When the ramp signal VRAMP crosses over the voltage VIPS, the output of the comparator 107 switches its level, driving the pulse generator 108 to generate a single pulse output which can be used as an internal clock signal for the circuits inside this module, and also can be outputted from the synchronization signal output pin SynOUT, to be the synchronization input signal SynIN of the next stage circuit module.

Please refer to FIG. 7. Because VIPS is in inverse proportion to VPS, that is, VIPS is in inverse proportion to N, a proper peak value VPEAK can be assigned such that VIPS=VPEAK when N=1. Thus, when N=2, VIPS=(1/2)VPEAK; when N=3, VIPS=(1/3)VPEAK; and so on. And the phase difference between the synchronization input signal SynIN and the synchronization output signal SynOUT is equal to 360°×VIPS/VPEAK, that is, 360°/N.

Figure 8:
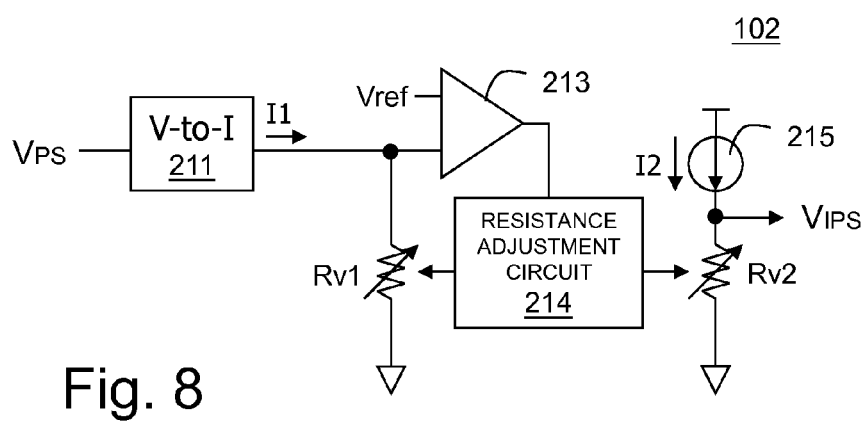
FIG. 8 illustrates an embodiment of the inverse-proportional voltage generator 102.

FIG. 8 shows an embodiment of the inverse-proportional voltage generator 102, which includes a voltage-to-current converter circuit 211, an error amplifier 213, a resistance adjustment circuit 214, a current source 215, and two variable resistors Rv1 and Rv2, wherein the two variable resistors Rv1 and Rv2 are controlled and synchronously adjusted by an output of the resistance adjustment circuit 214 such that Rv1 is in direct proportion to Rv2, and for simplicity in description, it is assumed that Rv1=Rv2. The resistance adjustment circuit 214 can be, for example but not limited to, an up-down counter. The voltage-to-current converter circuit 211 converts the voltage VPS to a current I1 which is in direct proportion to VPS. The current I1 flows through the variable resistor Rv1 to generate a voltage (I1·Rv1). Because the error amplifier 213, the resistance adjustment circuit 214, and the variable resistor Rv1 compose a feedback loop, the voltage (I1·Rv1) is balanced at the reference voltage Vref, that is, (I1·Rv1)=Vref, and this means that Rv1 is in inverse proportion to I1. The current generated by the current source 215 flows through the variable resistor Rv2 to generate a voltage VIPS, that is, (I2·Rv2)=VIPS. Because Rv1=Rv2 and I2 is a constant, (I2·Rv2) is in direct proportion to Rv1 and in inverse proportion to I1, that is, VIPS is in inverse proportion to VPS. The relationship between the voltage VIPS and the peak value VPEAK can be set by assigning proper parameters to the circuit devices.

Figure 9:
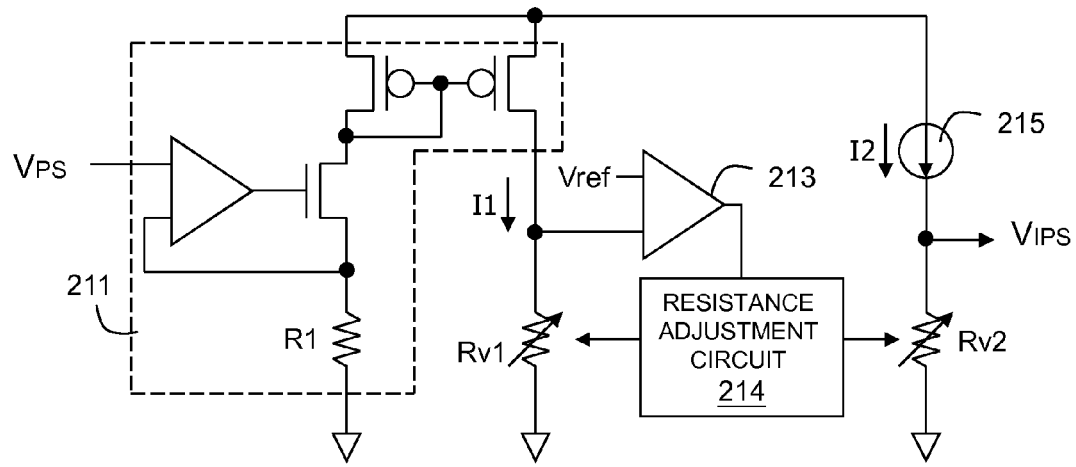
FIG. 9 illustrates an embodiment of the voltage-to-current converter circuit 211.

The voltage-to-current converter circuit 211 in the above embodiment can be, for example, a circuit shown in FIG. 9, wherein a source follower circuit converts the voltage VPS into a current VPS/R1 and then, through a current mirror circuit, duplicate the current VPS/R1 to generate the current I1 which is in direct proportion to VPS/R1.

Figure 10:
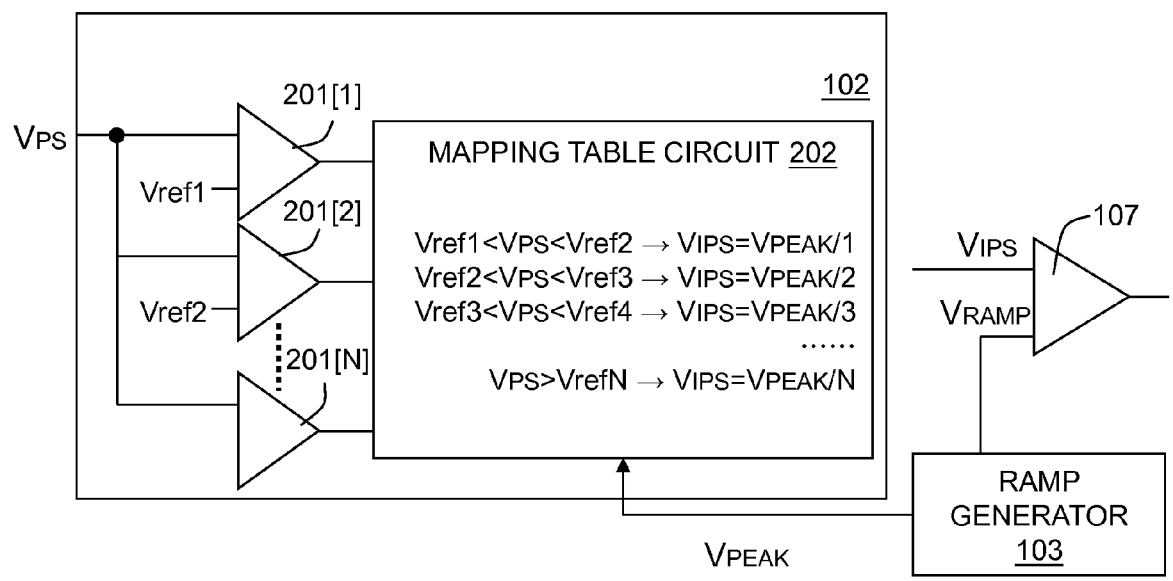
FIG. 10 illustrates another embodiment of the inverse-proportional voltage generator 102.

FIG. 10 shows another embodiment of the inverse-proportional voltage generator 102. In this embodiment the voltage VIPS is not exactly in inverse proportion to the voltage VPS, but it still can achieve the purpose of the present invention. As shown in the figure, the circuit includes multiple comparators 201[1]-201[N], which respectively compare the voltage VPS with reference voltages Vref1-VrefN, and the comparing results are inputs of a mapping table 202 which generate the voltage VIPS roughly in inverse-proportion to the voltage VPS. The relationship between the voltages VPS and VIPS is shown in the figure: when the voltage VPS is between Vref1 and Vref2, the voltage VIPS is equal to the peak value VPEAK, and there is no phase difference; when the voltage VPS is between Vref2 and Vref3, the voltage VIPS is equal to VPEAK/2 and the phase difference is 180°; and when the voltage VPS is between Vref3 and Vref4, the voltage VIPS is equal to VPEAK/3 and the phase difference is 120°, etc. The information of the peak value VPEAK can be obtained from the ramp generator 103.

Figure 1:
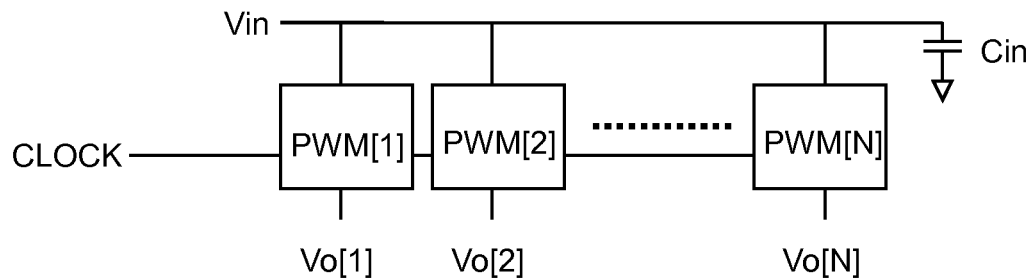
FIG. 1 illustrates a structure wherein multiple switching circuit modules are connected to the same input voltage Vin.
Figure 2:
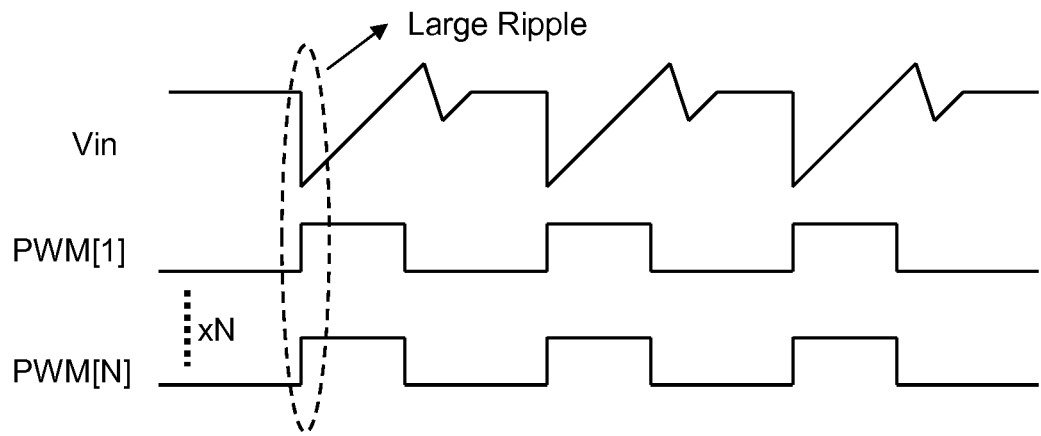
FIG. 2 illustrates a problem that may be caused by the structure of FIG. 1 when every circuit module has the same clock phase.
Figure 3:
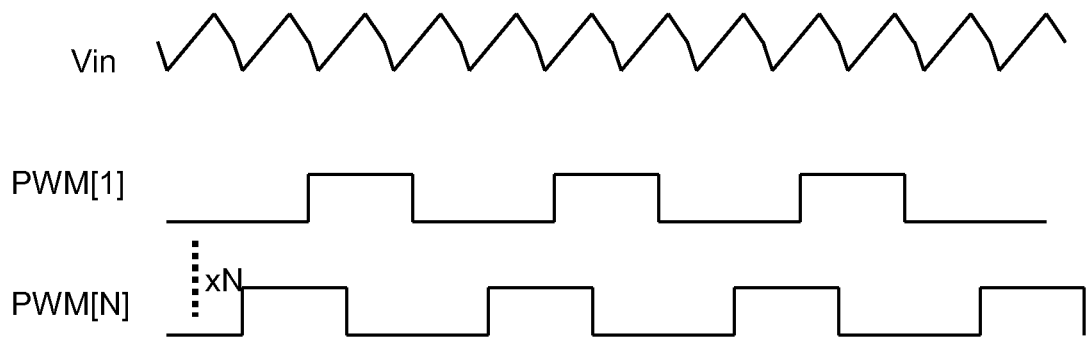
FIG. 3 shows that it is better to shift the clock phases from one circuit module to another.
Figure 4:
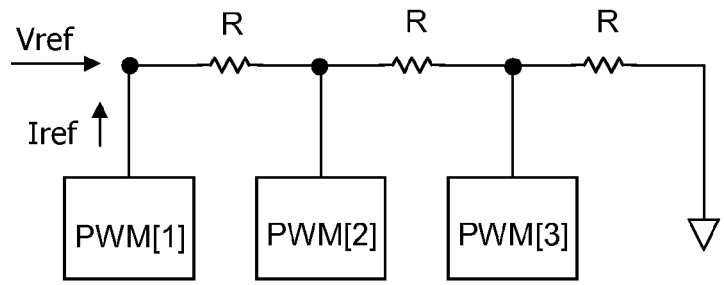
FIG. 4 shows a prior art arrangement to shift the clock phases.
Figure 11:
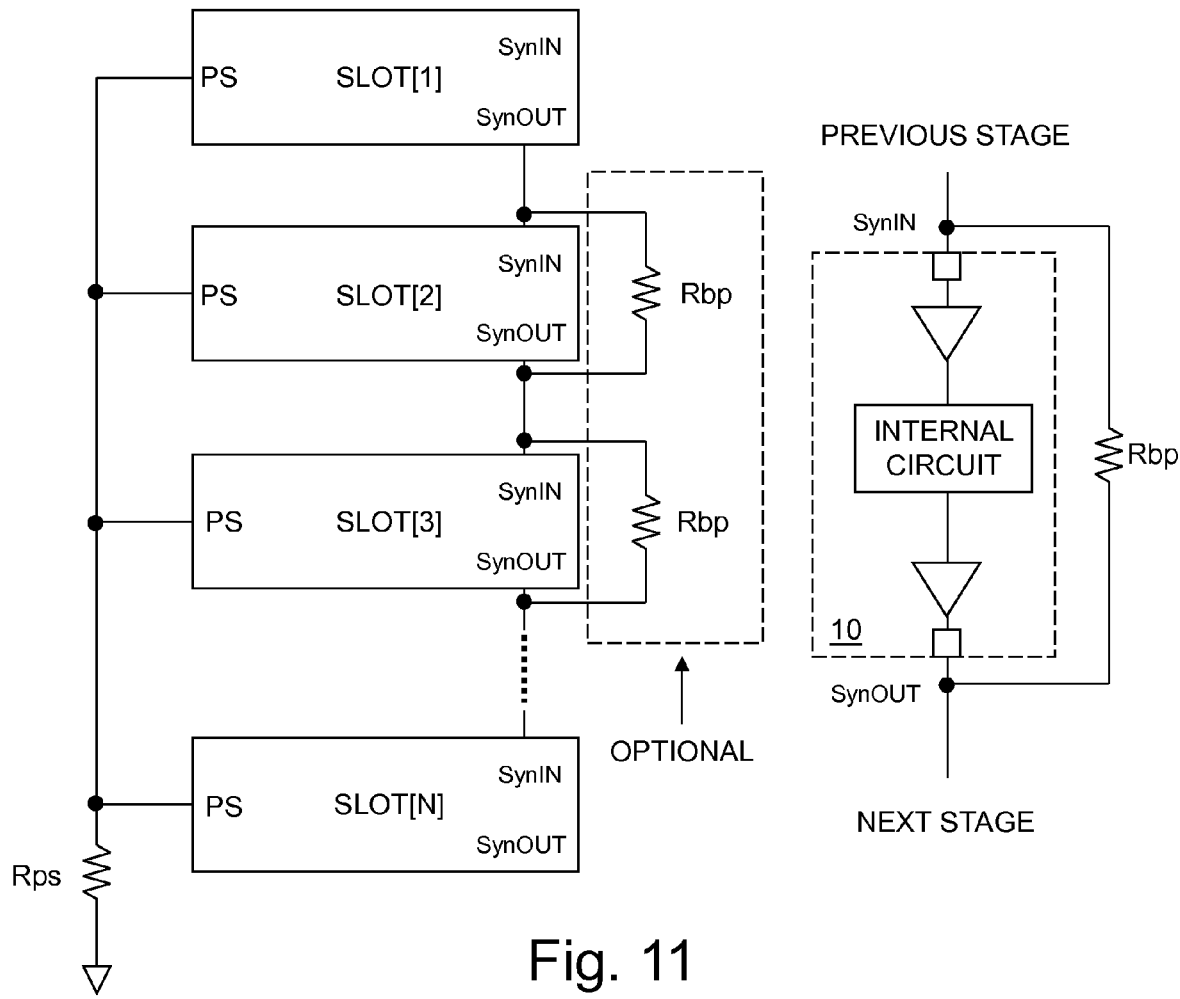
FIG. 11 illustrates that the present invention can become more flexible by providing bypass resistors Rbp.

Please refer to FIG. 11. The circuit board provides multiple slots SLOT[1]-SLOT[N], and let us first assume that no bypass resistor Rbp (surrounded by dashed lines) is provided. In this case, a user can mount any number of circuit modules on the circuit board starting from the first slot SLOT[1], wherein the number of circuit modules does not need to be the same as the number of the slots. Only one resistor Rps is required (corresponding to the current-to-voltage converter circuit 20 in FIG. 5) as shown in the left side of the circuit board, unlike the prior art in FIG. 4 wherein multiple resistors are required in correspondence to the number of the circuit modules. On the other hand, when the user intends to reduce the number of the mounted circuit modules, he can remove any number of circuit modules starting from the last slots SLOT[N].

However, to be more flexible, the circuit board can provide bypass resistors Rbp (surrounded by dashed lines), connected as shown. The function of the bypass resistors can be understood from the following example. Assuming that the user has already mounted four circuit modules in the slots SLOT[1]-SLOT[4], but due to some reason, the user wants to remove a particular circuit module from the second slot SLOT[2] or the third slot SLOT[3] instead of the last slot SLOT[4]. If a middle circuit module (such as the second circuit module) is removed without a bypass resistor Rbp, the synchronization output signal from the circuit module in the first slot SLOT[1] cannot be transmitted to the circuit module in the third slot SLOT[3]. But in the embodiment shown in the figure, due to the bypass resistor Rbp, the synchronization output signal SynOUT of the previous stage circuit module still can be transmitted to the next stage circuit module even though one or two circuits in between are removed. From a different view, the user can mount circuit modules arbitrarily in any available slot, not sequentially, if such bypass resistor Rbp is provided for a slot which is not mounted with a circuit module.

As the right side of the figure shows, if the bypass resistor Rbp is provided, when the circuit module 10 is in the slot, the synchronization output signal SynOUT is determined by the circuit module 10; when the circuit module 10 is not in the slot, the synchronization output signal SynOUT is determined by the signal SynIN in the figure (in this case the signal SynIN would be the synchronization output signal SynOUT of the previous stage circuit module which is still on the circuit board), transmitted through the bypass resistor Rbp. The resistance of the bypass resistor Rbp can be set such that when the circuit module 10 is in the slot, the signal transmitted through the bypass resistor Rbp has no actual influence such that it would not interfere with the synchronization output signal SynOUT of the circuit module 10.

Figure 12:
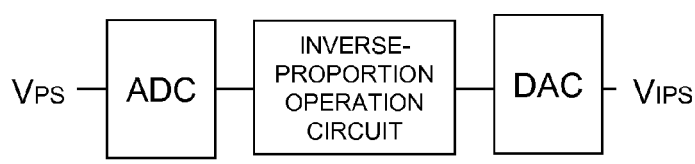
FIG. 12 illustrates another embodiment of the inverse-proportional voltage generator 102.
Figure 13:
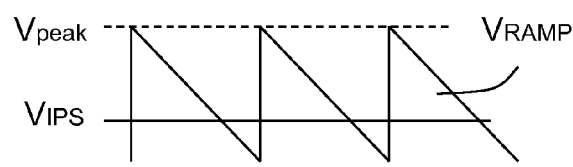
FIG. 13 illustrates another type of ramp waveform that can be generated by the ramp generator 103, which also works to achieve the purpose of the present invention.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the inverse-proportional voltage can be generated in other ways, such as shown in FIG. 12: the voltage VPS is analog-to-digital converted to a digital signal; a digital operation is performed to obtain an inverse proportion number of the digital voltage VPS; and the inverse proportion number is digital-to-analog converted to the voltage VIPS. As another example, the ramp generator 103 can generate another type of ramp waveform as shown in FIG. 13. In view of the foregoing, the spirit of the present invention should cover all such and other modifications and variations, which should be interpreted to fall within the scope of the following claims and their equivalents.

What is claimed is:

1. An adaptive phase-shifted synchronization clock generation circuit, comprising:
   a current-to-voltage converter circuit coupled to a phase setting node; and
   a plurality of circuit modules each including:
      at least one current source generating and determining a current which flows through a node to generate a node voltage on the node;
      an inverse-proportional voltage generator coupled to the node for generating a voltage which is inverse-proportional to the node voltage;
      a ramp generator receiving a synchronization input signal from a synchronization signal input pin and generating a ramp signal;
      a comparator comparing the inverse-proportional voltage to the ramp signal; and
      a pulse generator for generating a clock signal according to an output from the comparator, the clock signal being provided as an internal clock signal of the corresponding circuit module and outputted from a synchronization signal output pin as a synchronization output signal;
   wherein the node voltage is proportional to a total number of the circuit modules coupled to the node, and the inverse-proportional voltage is inverse-proportional to the total number of the circuit modules coupled to the node, whereby a phase difference between the synchronization output signal and the synchronization input signal of each of the circuit modules is automatically adjusted according to the inverse-proportional voltage; and
   wherein the synchronization signal input pin of the first one of the circuit modules receives a system clock and the synchronization signal input pin of each of the other circuit modules receives the synchronization output signal from the previous circuit module as the synchronization input signal of the present circuit module.

2. The circuit of claim 1, further comprising: at least one bypass resistor coupled between the synchronization input signal pin and the synchronization output signal pin of one of the circuit modules.

3. The circuit of claim 1, wherein the current-to-voltage converter circuit is a resistor whose resistance determines the voltage on the node.

4. A method for generating phase-shifted synchronization clock, comprising:
   (A) generating a current which flows through a node to generate a node voltage on the node, wherein the node is for coupling to a plurality of circuit modules;
   (B) generating a voltage which is inverse-proportional to the node voltage;
   (C) comparing the inverse-proportional voltage to a ramp signal whose period is determined by a synchronization input signal; and
   (D) generating a clock signal according to the comparison result;
   wherein the node voltage is proportional to a total number of the circuit modules coupled to the node, and the inverse-proportional voltage is inverse-proportional to the total number of the circuit modules coupled to the node, whereby a phase difference between the clock signal and the synchronization input signal is automatically adjusted according to the inverse-proportional voltage.

5. The method of claim 4, further comprising: providing a plurality of circuit modules and performing step (A)-(D) in each of the circuit modules, wherein the node in step (A) is a common node electrically connected with all circuit modules.

6. The method of claim 5, wherein the first one of the circuit modules receives a system clock as its synchronization input signal and each of the other circuit modules receives the clock signal generated by the previous circuit module as the synchronization input signal of the present circuit module.

7. An adaptive phase-shifted synchronization clock generation circuit, comprising:
   a first current source generating and determining a current which flows through a node to generate a node voltage on the node, wherein the node is for coupling to a plurality of circuit modules;
   an inverse-proportional voltage generator coupled to the node for generating a voltage which is inverse-proportional to the node voltage;
   a ramp generator receiving a synchronization input signal and generating a ramp signal;
   a first comparator comparing the inverse-proportional voltage to the ramp signal; and
   a pulse generator for generating a clock signal according to an output from the first comparator;
   wherein the node voltage is proportional to a total number of the circuit modules coupled to the node, and the inverse-proportional voltage is inverse-proportional to the total number of the circuit modules coupled to the node, whereby a phase difference between the clock signal and the synchronization input signal is automatically adjusted according to the inverse-proportional voltage.

8. The circuit of claim 7, wherein the clock signal is provided as an internal clock signal and a synchronization output signal.

9. The circuit of claim 7, wherein the inverse-proportional voltage generator comprises:
   a plurality of second comparators comparing the voltage on the node with a plurality of predetermined reference voltages, respectively; and
   a mapping table circuit determining the inverse-proportional voltage according to outputs of the plurality of second comparators.

10. The circuit of claim 7, wherein the inverse-proportional voltage generator comprises:
    an analog-to-digital converter circuit converting the voltage on the node to a digital signal;
    an inverse-proportion operation circuit computing an inverse proportion of the digital signal; and
    a digital-to-analog converter circuit converting the inverse proportion to an analog signal.

11. The circuit of claim 1, wherein the phase difference is automatically adjusted to be 360 degrees divided by the total number of the circuit modules.

12. The method of claim 4, wherein the phase difference is automatically adjusted to be 360 degrees divided by the total number of the circuit modules.

13. The circuit of claim 7, wherein the phase difference is automatically adjusted to be 360 degrees divided by the total number of the circuit modules.

* * * * *